United States Patent
Atwater, Jr. et al.

(10) Patent No.: US 7,019,339 B2
(45) Date of Patent: Mar. 28, 2006

(54) METHOD OF USING A GERMANIUM LAYER TRANSFER TO SI FOR PHOTOVOLTAIC APPLICATIONS AND HETEROSTRUCTURE MADE THEREBY

(75) Inventors: Harry A. Atwater, Jr., Pasadena, CA (US); James M. Zahler, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/125,133

(22) Filed: Apr. 17, 2002

(65) Prior Publication Data

US 2002/0190269 A1    Dec. 19, 2002

Related U.S. Application Data

(60) Provisional application No. 60/284,726, filed on Apr. 17, 2001.

(51) Int. Cl.
H01L 29/732    (2006.01)
H01L 31/072    (2006.01)
H01L 31/109    (2006.01)
H01L 31/0328   (2006.01)
H01L 31/0336   (2006.01)

(52) U.S. Cl. .............. 257/184; 257/616; 257/183; 257/200; 438/933; 438/752

(58) Field of Classification Search ............ 257/200, 257/183, 184, 616; 438/933, 752
See application file for complete search history.

(56) References Cited

U.S. PATENT DOCUMENTS 5,013,681 A    5/1991  Godbey et al.
5,217,564 A    6/1993  Bozler et al.
5,231,047 A *  7/1993  Ovshinsky et al. ........... 438/96
5,374,564 A    12/1994 Bruel (Continued)

FOREIGN PATENT DOCUMENTS

JP    03-270220    2/1991
WO    WO 01/03172  1/2001

OTHER PUBLICATIONS

Tong et al.. Wafer Bonding and Layer Splitting for Microsystems, Adv. Mater., 1999, pp. 1409–1425, vol. 11, No. 17, Wiley-VCH Verlag Gmbh.*
Bett et al., III–V Compounds for Solar Cell Applications, Appl. Phys. A, 1999, pp. 119–129, vol. 69, Springer-Verlag (published online: Jun. 24, 1999).
Bruel et al., Smart-Cut: A New Silicon On Insulator Material Technology Based on Hydrogen Implantation and Wafer Bonding, Mar. 1997, pp. 1636–1641, vol. 36, Jpn. J. Appl. Phys.

(Continued)

Primary Examiner—Minhloan Tran
Assistant Examiner—Victor A. Mandala, Jr.
(74) Attorney, Agent, or Firm—Foley & Lardner LLP

(57) ABSTRACT

Ge/Si and other nonsilicon film heterostructures are formed by hydrogen-induced exfoliation of the Ge film which is wafer bonded to a cheaper substrate, such as Si. A thin, single-crystal layer of Ge is transferred to Si substrate. The bond at the interface of the Ge/Si heterostructures is covalent to ensure good thermal contact, mechanical strength, and to enable the formation of an ohmic contact between the Si substrate and Ge layers. To accomplish this type of bond, hydrophobic wafer bonding is used, because as the invention demonstrates the hydrogen-surface-terminating species that facilitate van der Waals bonding evolves at temperatures above 600° C. into covalent bonding in hydrophobically bound Ge/Si layer transferred systems.

51 Claims, 4 Drawing Sheets

U.S. PATENT DOCUMENTS

| | | | |
|---|---|---|---|
| 5,391,257 | A | 2/1995 | Sullivan et al. |
| 5,637,187 | A | 6/1997 | Takasu et al. |
| 5,641,381 | A | 6/1997 | Bailey et al. |
| 5,713,057 | A | 1/1998 | Williams et al. |
| 5,877,070 | A * | 3/1999 | Goesele et al. ............. 438/458 |
| 5,882,987 | A | 3/1999 | Srikrishnan |
| 6,020,252 | A | 2/2000 | Aspar et al. |
| 6,103,597 | A | 8/2000 | Aspar et al. |
| 6,150,239 | A * | 11/2000 | Goesele et al. ............. 438/458 |
| 6,221,738 | B1 * | 4/2001 | Sakaguchi et al. .......... 438/455 |
| 6,242,324 | B1 | 6/2001 | Kub et al. |
| 6,323,108 | B1 | 11/2001 | Kub et al. |
| 6,328,796 | B1 | 12/2001 | Kub et al. |
| 6,346,458 | B1 | 2/2002 | Bower |
| 6,429,104 | B1 | 8/2002 | Auberton-Herve |
| 6,465,327 | B1 | 10/2002 | Aspar et al. |
| 6,497,763 | B1 | 12/2002 | Kub et al. |
| 6,504,091 | B1 * | 1/2003 | Hisamatsu et al. ......... 136/262 |
| 6,794,276 | B1 | 9/2004 | Letertre et al. |
| 6,815,309 | B1 | 11/2004 | Letertre et al. |
| 6,908,828 | B1 | 6/2005 | Letertre et al. |
| 2003/0064535 | A1 | 4/2003 | Kub et al. |
| 2004/0235268 | A1 | 11/2004 | Letertre et al. |
| 2005/0032330 | A1 | 2/2005 | Ghselen et al. |

OTHER PUBLICATIONS

Cheng et al., Electron Mobility Enhancement in Strained– Si n–MOSFETs Fabricated on SiGe–on–Insulator (SGOI) Substrates, IEEE Electron Device Letters, Jul. 2001, pp. 321–323, vol. 22, No. 7.

Dobaczewski et al., Donor Level on Bond–Center Hydrogen in Germanium, Physical Review B, 2004, pp. 245207–1–6, vol. 69.

Georgakilas et al., Wafer–scale Integration of GaAs Optoelectronic Devices with Standard Si Integrated Circuits Using a Low–Temperature Bonding Procedure, Applied Physics Letters, Dec. 2002, pp. 5099–5101, vol. 81, No. 27, American Institute of Physics (Downloaded Oct. 19, 2004).

Gosele et al., Fundamental Issues in Wafer Bonding, J. Vac. Sci. Technol. A, Jul./Aug. 1999, pp. 1145–1152, vol. 17(4), American Vacuum Society.

Gosele et al., Semiconductor Wafer Bonding. Annu. Rev. Mater. Sci., 1998, pp. 215–241, vol. 28.

Huang et al., SiGe–on–Insulator Preparared by Wafer Bonding and Layer Transfer for High–Performance Field–Effect Transistors, Applied Physics Letters, Feb. 2001, pp. 1267–1269, vol. 78, No. 9, American Institute of Physics.

Huang et al., Electron and Hole Mobility Enhancement in Strained SOI by Wafer Bonding, IEEE Transactions on Electron Devices, Sep. 2002, pp. 1566–1571, vol. 49, No. 9.

Langdo et al., Strained Si on Insulator Technology: From Materials to Devices, Solid–State Electronics, 2004, pp. 1357–1367, vol. 48, Elsevier Ltd.

Leroy et al., Controlled Surface Nanopatterning with Buried Dislocation Arrays, Surface Science, 2003, pp. 211–219, vol. 545, Elsevier B.V.

Ma et al., Solid–State Reaction–Mediated Low–Temperature Bonding of GaAs and InP Wafers to Si Substrates, Appl. Phys. Lett., Feb. 1994, pp. 772–774, vol. 64, No. 6, American Institute of Physics.

Maleville et al., Smart–Cut® Technology: From 300 mm Ultrathin SOI Production to Advanced Engineered Substrates, Solid–State Electronics, 2004, pp. 1055–1063, vol. 48, Elsevier Ltd.

Morral et al., InGaAs/InP Double Heterostructures on InP/Si Templates Fabricated by Wafer Bonding and Hydrogen–Induced Exfoliation, Applied Physics Letters, Dec. 2003, pp. 5413–5415, vol. 83, No. 26, American Institute of Physics.

Tong et al., Wafer Bonding and Layer Splitting for Microsystems, Adv. Mater., 1999, pp. 1409–1425, vol. 11, No. 17, Wiley–VCH Verlag GmbH.

Tong et al., Layer Splitting Process in Hydrogen–Implanted Si, Ge, SiC, and Diamond Substrates, Appl. Phys. Letter, Mar. 1997, pp. 1390–1392, vol. 70, No. 11, American Institute of Physics.

Tong et al., Hydrophobic Silicon Wafer Bonding, Appl. Phys. Lett., Jan. 1994, pp. 625–627, vol. 64, No. 5, American Institute of Physics.

Tong et al., A "Smarter–Cut" Approach to Low Temperature Silicon Layer Transfer, Appl. Phys. Lett., Jan. 1998, pp. 49–51, vol. 72, No. 1, American Institute of Physics.

Zahler et al., Ge Layer Transfer to Si for Photovoltaic Applications, Thin Solid Films, 2002, pp. 558–562, vol. 403–404, Elsevier Science B.V.

Zahler et al., Wafer Bonding and Layer Transfer Processes for 4–Junction High Efficiency Solar Cells, 29th IEEE Photovoltaic Specialists Conference, New Orleans, USA, (May 2002).

Auberton–Herve et al., Smart–Cut®: The Basic Fabrication Process for UNIBOND® SOI Wafers, IEICE Trans. Electron, Mar. 1997, pp. 358–363, vol. E80–C, No. 3, The Institute of Electronics, Information and Communication Engineers.

Tracy et al., Germanium–on–Insulator Substrates by Wafer Bonding, Journal of Electronic Materials, 2004, pp– 886–892, vol. 33, No. 8.

Zahler et al., J. Electron Mater., 33(8), (2004), pp. 22–23, (Abstracts K2 and K3).

Akatsu et al., Wafer Bonding of Different III–V Compound Semiconductors by Atomic Hydrogen Surface Cleaning, Journal of Applied Physics, Oct. 2001, pp. 3856–3862, vol. 90, No. 8, American Institute of Physics.

Bruel M., Silicon on Insulator Material Technology, Electronics Letters, Jul. 1995, pp. 1201–1202, vol. 31, No. 14.

Bruel M., Application of Hydrogen Ion Beams to Silicon on Insulator Material Technology, Nuclear Instruments and Methods in Physics Research B, 1996, pp. 313–319, vol. 108, Elsevier Science B.V.

Kim et al., Heterogeneous Silicon Integration by Ultra–High Vacuum Wafer Bonding, Journal of Electronic Materials, 2003, pp. 849–854, vol. 32, No. 8.

Lagnado et al., Integration of Si and SiGe with $Al_2O_3$ (sapphire), Microelectronic Engineering, 2001, pp. 455–459, vol. 59, Elsevier Science B.V.

Taraschi et al., Strained Si, SiGe, and Ge On–Insulator: Review of Wafer Bonding Fabrication Techniques, Solid–State Electronics, 2004, pp. 1297–1305, vol. 48, Elsevier Ltd.

Wiegand et al., Wafer Bonding of Silicon Wafers Covered with Various Surface Layers, Sensors and Actuators, 2000, pp. 91–95, vol. 86, Elsevier Science B.V.

Yamaguchi M., Multi–Junction Solar Cells and Novel Structures for Solar Cell Applications, Physica E, 2002, pp. 84–90, vol. 14, Elsevier Science B.V.

Zahler et al., Wafer Bonded Ge/Si Heterostructures for Photovoltaic Applications, Presentation, MRS 2002 Fall Meeting, 16 pages, (Nov. 2002).

Zahler et al., Wafer Bonded Ge/Si Heterostructures for Photovoltaic Applications, (Presentation), Electronic Materials Conference 2002, 16 pages.

Zahler et al., Wafer Bonded Ge/Si Heterostructures for Photovoltaic Applications, (Abstract and Presentation), MRS 2002 Spring Meeting (Apr. 2002).

Zahler J.M., Materials Integration by Wafer Bonding and Layer Transfer, (Presentation), 13 pages, MRS 2004 Spring Meeting (Apr. 2004).

Zahler et al., The Role of H in the H–Induced Exfoliation of GE Films, (Abstract and Presentation), MRS 2004 Spring Meeting, 16 pages (Apr. 2004).

Zahler et al., Wafer Bonded Expitaxial Templates for GaAs/Si Heterostructures, (Abstract and Presentation), MRS 2003 Spring Meeting, 16 pages, (Apr. 2003).

Zahler et al., Wafer Bonded Expitaxial Templates for GaAs/Si and InP/Si Heterostructures, (Presentation), MRS 2003 Fall Meeting, 15 pages, (Nov. 2003).

Zahler et al., Wafer Bonding Processes for Ultrahigh Efficiency Photovoltaic Applications, (Abstract and Presentation), MRS 2001 Fall Meeting, (Nov. 2001).

Zahler et al., GE Layer Transfer to Si for Photovoltaic Applications, (Presentation), 14 pages, MRS 2001 Spring Conference, (Apr. 2001).

Zahler et al., Wafer Bonding and Layer Transfer Processes for A 4–Junction Solar Cell, (Presentation) 29$^{th}$ IEEE Photovoltaic Specialists Conference, New Orleans, USA, (May 2002).

Zahler et al., Ge/Si Wafer Bonded Epitaxial Templates for GaAs/Si Heterostructures, (Abstract), MRS 2002 Fall Meeting, (Nov. 2002).

Morral et al., Bonding and Layer Transfer Process of InP on Silicon for the Elaboration of the Botton Double Heterostructure of 4–Junction High Efficiency Solar Cells, (Abstract), MRS 2002 Fall Meeting, (Nov. 2002).

Morral et al., Assessment of Optical and Structural Properties of III–V Semiconductors Grown on InP/Si and Ge/Si Wafer Bonded Epitaxial Templates with Application to a Four–Junction Solar Cell, (Abstract), MRS 2003 Spring Meeting, (Apr. 2003).

Morral et al., Electrical and Structural Characterization of the Interface of Wafer Bonded InP/Si, MRS 2003 Spring Meeting, (Apr. 2003).

Morral et al., The Role of Hydrogen in H–Induced Exfoliation and Layer Transfer on InP, (Abstract), MRS 2004 Spring Meeting, (Apr. 2004).

Weldon et al., "Mechanism of Silicon Exfoliation Induced by Hydrogen/Hellium Co–Implantation," Applied Physics Letters, vol. 73, No. 25, Dec. 21, 1998, pp. 3721–3723.

* cited by examiner

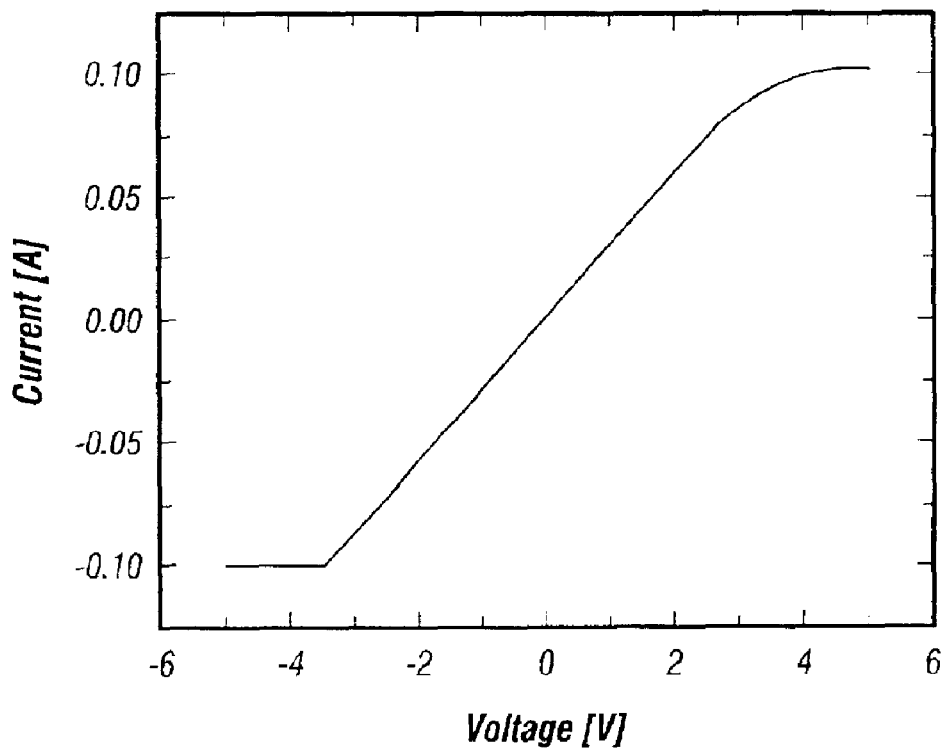
FIG. 1
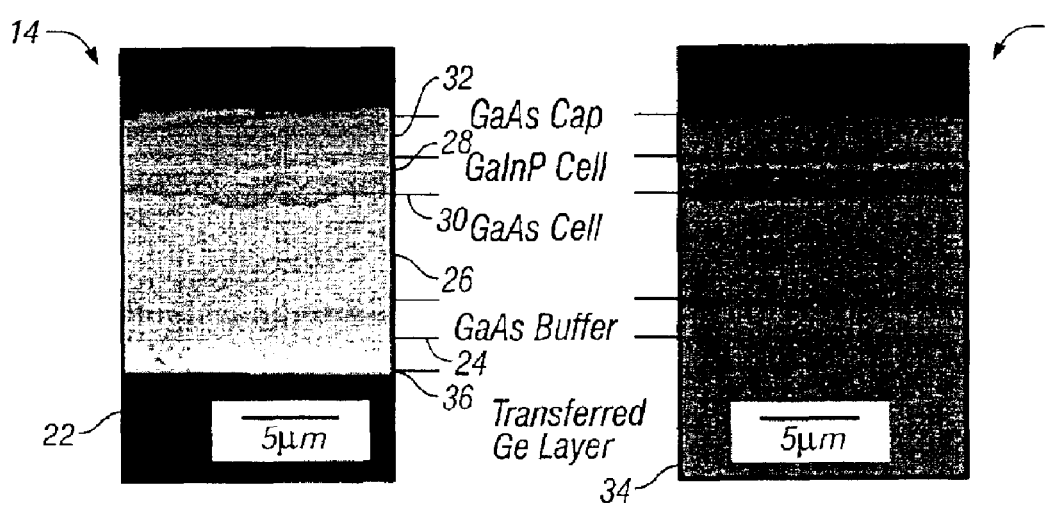
FIG. 2A  FIG. 2B

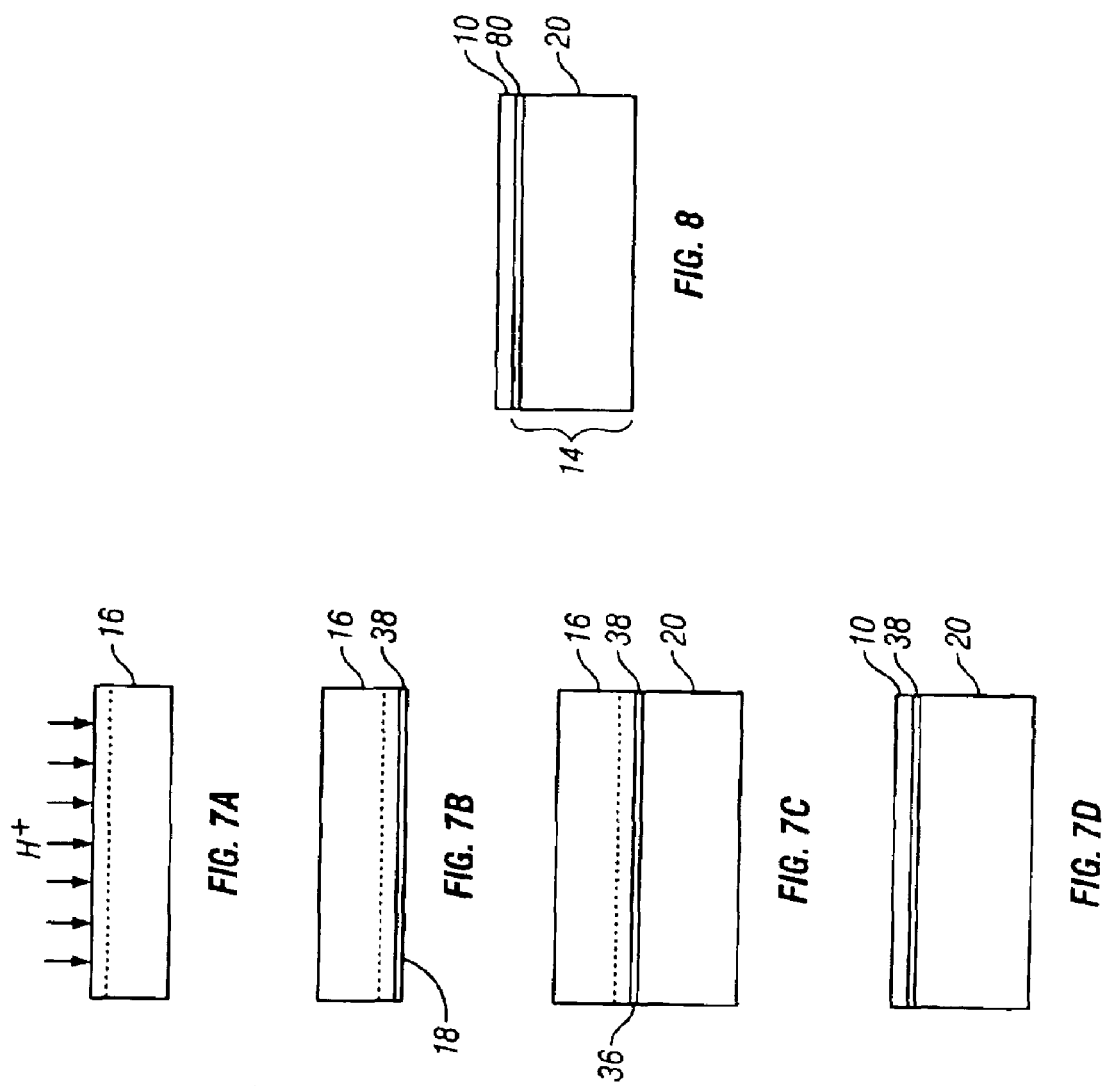

METHOD OF USING A GERMANIUM LAYER TRANSFER TO SI FOR PHOTOVOLTAIC APPLICATIONS AND HETEROSTRUCTURE MADE THEREBY

RELATED APPLICATIONS

The present application is related to U.S. Provisional Patent Application, Ser. No. 60/284,726, filed on Apr. 17, 2001, and claims priority to it under 35 USC 119.

STATEMENT REGARDING FEDERALLY SPONSORED RESEARCH OR DEVELOPMENT

The U.S. Government may have certain rights in this invention pursuant to subcontract number ACQ-1-30619-13 from the NREL.

BACKGROUND OF THE INVENTION

1. Field of the Invention

The invention relates to the field of semiconductor processing of films and in particular to processing nonsilicon films on heterostructures.

2. Description of the Prior Art

Group III–V semiconductor layered structures grown on bulk germanium substrates have been used in the prior art to create high efficiency triple-junction solar cells with efficiencies greater than 30%. However, these are prohibitively expensive for all but space applications, because the Ge substrate constitutes a large portion of this cost.

Therefore, what is needed is some type of methodology whereby Ge and other nonsilicon films can be made on heterostructures, e.g. integrated with silicon substrates.

BRIEF SUMMARY OF THE INVENTION

Ge/Si and other nonsilicon film heterostructures are formed by hydrogen-induced exfoliation or spitting of the Ge or nonsilicon film and then wafer bonded to a cheaper substrate, such a Si, glass, ceramic or the like, as a way to reduce product cost, while, for example, maintaining solar cell device performance from the heterostructures fabricated from such films. The illustrated embodiment of the invention describes a Ge film, but it is to be expressly understood that other semiconductor materials could similarly be employed in a manner consistent with the spirit and scope of the invention. For example, GaAs and InP films might also be employed.

In the illustrated embodiment by transferring thin, single-crystal layers of Ge to a less expensive Si substrate and reclaiming the donor wafer through a polishing process, a single 300 μm thick Ge wafer serves as a source for transfer of more than one hundred thin Ge layers or films.

The bond at the interface of the Ge/Si heterostructures is covalent to ensure good thermal contact, mechanical strength, and to enable the formation of an ohmic contact between the Si substrate and Ge layers. To accomplish this type of bond hydrophobic wafer bonding is used, because the hydrogen-surface-terminating species that facilitate van der Waals bonding evolves at temperatures above 600° C. into covalent bonding in hydrophobically bound Ge/Si layer transferred systems.

Thus, it can now be understood that one embodiment of the invention is defined as a method of forming a Ge-based heterostructure comprising the steps of $H^+$ or $He^+$ doping a Ge substrate by ion implantation, bonding the Ge substrate onto a non-Ge substrate and annealing the bonded structure to exfoliate a Ge film therefrom. Any Ge compatible composition may be used as the substrate with Si being the preferred embodiment. However, InP and GaAs are also expressly contemplated including generally any element or compound which includes elements from Groups III–V of the periodic table.

The Ge film is bonded onto a Si substrate in the illustrated embodiment. The step of bonding is comprised of the steps of disposing the Ge film in contact with the non-Ge substrate to define an interface between the Ge film and non-Ge substrate; applying at least a first magnitude of pressure across a corresponding first area of the interface; and annealing the interface under a second magnitude of pressure therebetween.

The step of applying at least a first magnitude of pressure across the interface further comprises the steps of sequentially applying additional magnitudes of pressure across corresponding areas of the interface, e.g. the steps of applying sequentially smaller magnitudes of pressure across sequentially larger areas of the interface. In the illustrated embodiment the step of sequentially applying additional magnitudes of pressure comprises the step of sequentially applying three magnitudes of pressure are applied across three corresponding sized areas of the interface, namely applying a first magnitude of pressure, which is approximately 24 MPa across an approximately 0.64 cm diameter area, followed by approximately 6.1 MPa across an approximately 1.3 cm diameter area, followed by approximately 1.5 MPa across an approximately 2.5 cm diameter area. The step of annealing the bonded structure under a second magnitude of pressure therebetween comprises the step of annealing the interface at approximately 175° C. under approximately 930 kPa of pressure therebetween.

In another embodiment the method further comprises the step of passivating the non-Ge substrate prior to disposing the Ge film in contact therewith.

In still another embodiment the method further comprises the step of disposing an anti-bubble layer onto the Ge substrate to create a hydrophilic interface therebetween and thus to reduce hydrogen bubble formation when the Ge substrate is bonded to the non-Ge substrate. Where the substrate is Si, the step of disposing a anti-bubble layer onto the Ge substrate comprises the step of disposing an amorphous Si layer onto the Ge substrate to form a Si/a-Si interface by molecular beam deposition.

In yet another embodiment the method further comprises the steps of wet chemical cleaning the Ge substrate and non-Ge substrate prior to bonding and then annealing the cleaned Ge substrate and non-Ge substrate prior to bonding, namely annealing the cleaned Ge substrate and non-Ge substrate at approximately 250° C. In $N_2$.

In another embodiment the method further comprises the step of fabricating a semiconductor device onto the Ge-based heterostructure, such as a triple junction solar cell thereon using metal-organic chemical vapor deposition (MOCVD).

In a further embodiment the method further comprises the step of disposing a smoothing layer onto the exfoliated Ge film, namely a Ge buffer layer using molecular beam epitaxy. Smoothing techniques that may also be applied to the exfoliated film also include CMP and chemical etching processes.

The invention is also understood to be defined as a Ge-based heterostructure comprising a Ge film, and a non-Ge substrate bonded to the Ge film in which the Ge film has been exfoliated from an $H^+$ ion implanted Ge layer by annealing. Again in the illustrated embodiment the non-Ge substrate is composed of Si, but is expressly meant to include other elements, compounds, and mixtures which include at least in part elements from Groups III–V of the periodic table.

The Ge substrate and non-Ge substrate are in mutual contact under pressure and annealed to form a covalent bonded interface therebetween. The Ge substrate and non-Ge substrate are brought into mutual contact with each other and subjected to sequential applications of pressure distributed over an area of the interface, namely sequentially smaller magnitudes of pressure across sequentially larger areas of the interface. The non-Ge substrate and Ge substrate are passivated prior to being bonded. As discussed above, an anti-bubble layer may be disposed onto the Ge substrate to create a hydrophilic interface therebetween and thus to reduce hydrogen bubble formation when the Ge film is bonded to the non-Ge substrate, namely where the non-Ge substrate is Si and the anti-bubble layer is amorphous Si. Alternatively, as also discussed above the non-Ge substrate is rendered hydrophilic or hydrophobic by wet chemical cleaning the Ge substrate and non-Ge substrate prior to bonding and then annealing the cleaned Ge film and non-Ge substrate prior to bonding.

The Ge-based heterostructure is an intermediate structure and generally a semiconductor device will be fabricated on the Ge film. The illustrated embodiment shows the fabrication of a triple junction solar cell thereon using metal-organic chemical vapor deposition (MOCVD). However, what type of semiconductor device can be fabricated on the Ge film is quite arbitrary and should be understood to include any semiconductor device now known or later devised. For example, it is expressly contemplated that in addition to solar cells that GaAs based LEDs and lasers will be fabricated on Ge film heterostructures of the invention As discussed the Ge-based heterostructure of the invention also may include a smoothing layer onto the exfoliated Ge film, namely a Ge layer disposed onto the exfoliated Ge film using molecular beam epitaxy.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1 is a graph of a voltage-current curve for a P+Ge/P+Si heterostructure fabricated according to the invention which has been annealed to 350° C. demonstrate ohmic electric contact.

FIG. 2a is a vertical cross-sectional view of a scanning electron microscope image of a MOCVD triple-junction solar cell structure grown according to the invention on a Ge/Se heterostructure template.

FIG. 2b is a vertical cross-sectional view of a scanning electron microscope image of a MOCVD triple-junction solar cell structure grown according to the invention on a bulk Ge substrate.

FIGS. 6a–6c are diagrammatic side cross sectional views of the method of fabrication of one embodiment of the invention.

FIGS. 7a–7d are diagrammatic side cross sectional views of the method of fabrication of another embodiment of the invention.

FIG. 8 is a diagrammatic side cross sectional view of still another embodiment of the heterostructure.

Figure 3:
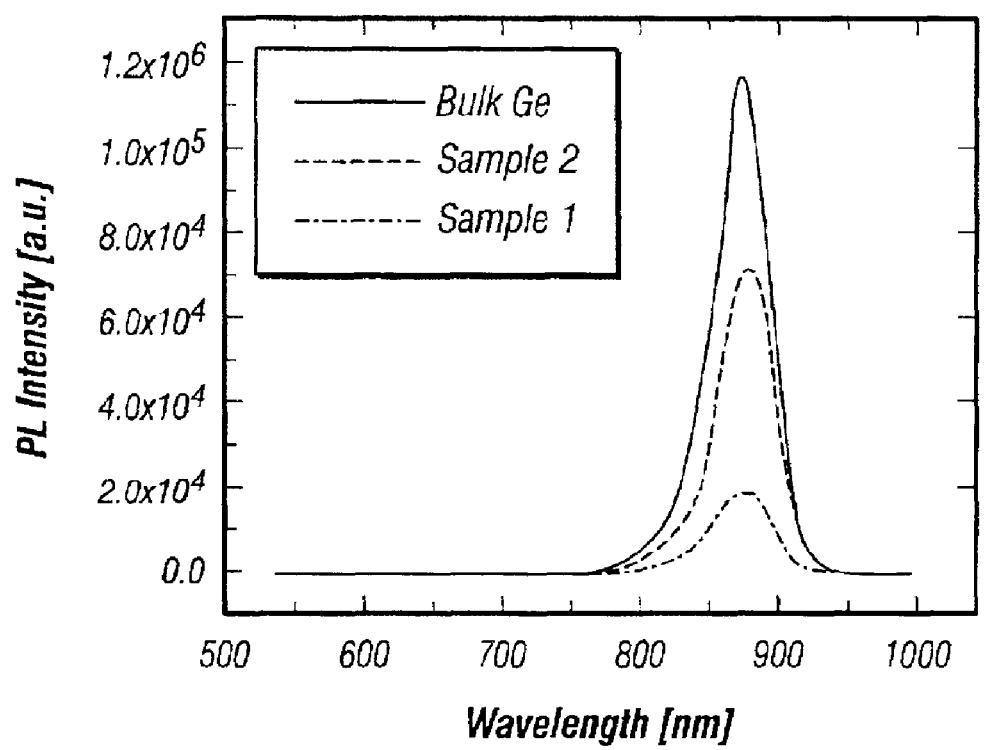
FIG. 3 is a graph of the GaAs band-edge emission photoluminescence of MOCVD triple-junction tandem solar cells on Ge/Si heterostructures in Samples 1 and 2 shown in dotted line and on bulk Ge in solid line.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The invention uses direct wafer bonding in combination with hydrogen-induced layer splitting of germanium to transfer single crystal germanium (100) films 10 to silicon (100) substrates 12 as shown in FIGS. 2a and 2b without using an intervening metallic bonding layer as is typical in the prior art. The metal-free nature of the bond makes the bonded wafers suitable, for example, for subsequent epitaxial growth of triple-junction GaInP/GaAs/Ge layered solar cells, generally denoted by reference numeral 14, at high temperatures without concern about metal contamination of the device active region.

The Exfoliation and Rebonding

As shown in FIG. 6a a germanium crystalline wafer 16 was doped with $1 \times 10^{17}$ cm$^{-2}$ H$^+$ at 80 keV. These wafers 16 are rendered strongly hydrophobic in the process. The embedded H$^+$ coalesce into hydrogen gas bubbles, which induced an upper film 10 of wafer 16 to split off by a thermal cycle up to more than 350° C. in an N$_2$ ambient. Layer splitting is achieved by the formation of hydrogen-containing platelets that initiate the propagation of microcracks parallel to the Ge surface 18 upon annealing to greater than 350° C. with no external pressure on wafer 16. Thus, a film 10 is cleaved or exfoliated from wafer 16 and bonded to wafer 20 as diagrammatically shown in FIG. 6b. The process can be repeated many times and wafer 16 repeatedly split to form a plurality of exfoliated films 10. Film thickness can be varied by control of the H$^+$ doping concentrations and depths.

For example, in the illustrated embodiment doped germanium crystalline wafer 16 was used to transfer approximately 700 nm thick films 10 with an area of approximately 1 cm$^2$. Ge substrate surface 18 is passivated by removal of any organic contamination by cleaning by acetone and methanol followed by a 1 minute deionized water rinse and a 10 second dip in 5% HF acid followed in turn by surface blow drying to remove any oxide from surface 18 which is left coated with uncontaminated adsorbed hydrophobic H$^+$. Substrate 16 can now be bonded to a different and less costly substrate 20 having the desired electrical or physical properties, e.g. a silicon wafer 20 as shown in FIG. 6c, and annealed to transfer the film 10.

Si (100) wafer 20 was passivated by the same wet process sequence described above and a subsequent rinse followed by a deionized water rinse and a 30 second 80° C. 1:1:3 H$_2$O$_2$:NH$_4$OH:H$_2$O (RCA1) cleaning process followed by a deionized water rinse and a brief HF acid dip to remove the grown oxide. The RCA1 cleaning is included to further reduce the organic surface contamination and remove particles. Following surface passivation both Si substrate 20 and Ge substrate 10, they have an RMS roughness well under 0.5 nm as measured on a 5 µm by 5 µm atomic force microscopy scan.

After passivation substrate 20 and substrate 16 are brought into surface-to-surface contact with each other as shown in FIG. 6c and bonding is initiated by a 3500 psi pressure (24 MPa) applied over a 0.25-inch (0.64 cm) diameter region at the center of the wafer. The contact region is then propagated outward using subsequent pressures of 890 psi (6.1 MPa) applied over a 0.5-inch (1.3 cm) diameter region and 220 psi (1.5 MPa) applied over a 1.0-inch (2.5 cm) diameter region. A thermal annealing process to 175° C. with an applied pressure of 135 psi (930 kPa) in a modified Parr Instruments pressure cell is used to strengthen the bonding.

Hydrophobic surface passivation of film surface 18 and a less than 1 nm RMS roughness of surface 18 as measured by contact mode atomic force microscopy along with more than 3000 psi pressure initiation are suitable conditions for reversible room temperature bonding of substrate 16 to substrate 20 to occur. The low strength room temperature bond is then annealed at 175° C. under 135 psi pressure strengthen the bonding between substrate 16 and substrate 20. Annealing the bonded structure with or without pressure up to >300 C causes film 10 to transfer to substrate 20. The covalently bonded heterostructures have been shown to be stable during thermal cycling from room temperature to 750° C.

Ge-to-Si direct wafer bonding and layer transfer has been achieved as described above, but initial efforts were complicated by gas bubble formation at the bonded Ge/Si interface 36 between film 10 and substrate 20. These bubbles were likely caused by residual interface contamination present at the time of bonding, either in the form of adsorbed water or organic contamination which subsequently evolved as gas trapped at the interface 36. These bubbles have been eliminated by two methods.

The first method is by molecular beam deposition of a 40-Å amorphous Si layer 38 on the H-implanted Ge substrate 16 as diagrammatically shown in FIGS. 7a–7d. In this case, a hydrophilic or hydrophobic Si—Si wafer bond is later formed with substrate 20 using hydrophilic or hydrophobic surface passivation on both the substrate 20 and the a-Si layer 38 deposited on the Ge substrate 16. The room-temperature bonding energy for hydrophilic Si surfaces is typically about 100 mJ cm$^{-2}$ for Si/Si systems. The Ge/Si heterostructures 14 formed by Si/a-Si hydrophilic bonding show a strong reduction in the total number of interfacial bubbles. Bubble reduction is thought to be due to the increased hydrophilic bond strength at the Si/a-Si interface verses the hydrophobic room-temperature bond strength of the Ge/Si interface in the previously mentioned Ge/Si hydrophobic bonding technique. The higher bond strength increases the bubble pressure required to separate the bonded surfaces and to deform the thin Ge transferred film 10. Additionally, improved organic removal is made possible by the RCA1 cleaning of the a-Si layer 38.

The second method to eliminate bubbles at the interface 36 is to use a 250° C. pre-bonding anneal in N$_2$ following wet chemical cleaning, but prior to bonding the hydrophobic Ge and Si surfaces in the methodology of FIGS. 6a–6c. This pre-bonding anneal is thought to desorb water and evolve organic contaminants, leaving a more perfectly H-terminated surface. This reduces the bubble defect density in transferred films 10.

The Ohmic Contact

Electrical measurements indicated ohmic I–V characteristics for germanium layers bonded to silicon substrates with less than 35 ohms resistance at the interface such as shown in FIG. 1 and described below.

The interface electrical properties were measured by defining Al on a Ge/Si$^-$ heterostructure 14, prepared by a pre-bonding anneal in N$_2$ as described above, followed by a layer split anneal at 350° C. The Ge substrate was Ga-doped to $5\times10^{17}$ cm$^{-3}$ and the Si substrate was B doped to $1\times10^{18}$ cm$^{-3}$ in an effort to minimize the junction depletion width formed at the heterojunction interface 36.

During initial application of a 10 V bias, the Ge/Si interface 36 exhibited dielectric breakdown followed by ohmic I–V characteristics in subsequent scans as graphically depicted in FIG. 1. These measurements indicate an interfacial resistance of 35–40 Ω over a total interfacial area of about 0.1 cm$^2$ for a specific interfacial resistance of about 3.5 Ω cm$^{-2}$. The Al contact and substrate resistances were determined to be negligible for overall structure resistance. The relatively high interface resistance is attributed to the fact that the bonded Ge/Si sample was annealed at a maximum temperature of 350° C., lower than the temperature required for covalent bond formation, which is 600° C. or greater in Si/Si interfaces.

The Triple Junction Solar Cell

Triple-junction solar cell structures grown on these Ge/Si heterostructure templates by metal-organic chemical vacation deposition, MOVCD, as shown in FIGS. 2a and 2b and described below show comparable photoluminescence intensity and minority carrier lifetime to a control structure grown on bulk Ge as depicted in FIG. 3.

Metal organic chemical vapor deposition (MOCVD) growth of triple-junction solar cell heterostructures 14 in FIG. 2a on bonded Ge/Si substrate 22 was performed using (CH$_3$)$_3$Ga and AsH$_3$ precursors for GaAs cell growth and (CH$_3$)$_3$Ga, (CH$_3$)$_3$In and PH$_3$ precursors for GaInP cell growth. The peak temperature during growth was 750° C. and the structure as shown in FIG. 2a is comprised of a GaAs buffer layer 24 followed by two active base regions, a GaAs base 24 and a GaInP base 28 separated by a tunnel junction structure 30.

Photoluminescence (PL) intensity and time-resolved photoluminescence (TRPL) minority carrier lifetime of the structure of FIG. 2a were measured in the heavily doped GaAs top contact layer 32 in a control sample grown on bulk Ge 34 in FIG. 2b and structures grown on a Ge/Si heterostructure 14 in FIG. 2a. Photoluminescence measurements were performed with a pump laser operated at λ=457 nm. Because the heavily doped GaAs contact layer 32 was optically thick to the pump laser, photoluminescence was not observed in the GaInP base 28 or the GaAs base region 26, both of which are expected to exhibit higher lifetime and superior material quality to the heavily doped GaAs contact layer 32. Time-resolved photoluminescence measurements were performed at NREL with a 600-nm pump laser operated at a repetition rate of 1000 kHz. The samples were maintained at 293° K during the measurement. The results of the measurement are shown and described in connection with FIG. 3.

Triple-junction solar cell structures 14 as shown in FIG. 2a were grown by metal-organic chemical vapor deposition (MOCVD) on Ge/Si heterostructures fabricated by hydrophobic wafer bonding. Two of these Ge/Si heterostructures were used as templates for growth and labeled Sample 1 and Sample 2, while a control solar cell structure was also grown on bulk Ge in the same process as shown in FIG. 2b. The RMS surface roughness was measured by contact-mode atomic force microscopy, with the results shown in Table 1.

TABLE 1

| Sample | Ge roughness in Å Pre-MOCVD | Ge roughness in Å Post-MOCVD |
|---|---|---|
| Bulk Ge | <5 | 147 |
| Sample 1 | 236 | 897 |
| Sample 2 | 225 | 204 |

Sample 1 exhibited RMS surface roughness four-fold greater than that of the GaAs contact layer of Sample 2. These GaAs contact layer roughness values are uncorrelated to the exfoliated Ge surface roughness which was measured, a phenomenon that is not understood at present. Cross-sectional scanning electron micrographs of Sample 1 and the bulk Ge control structure are shown in FIGS. 2a and 2b respectively. These images show the layer structure of the triple-junction solar cell and the morphology of the interfaces of the various layers and abrupt interfaces within the microscope resolution, about 100 nm. Sample 1 exhibits a rough interface between the layers of the cell structure, with a maximum interface roughness of 0.3 mm located at the GaAs/GaInP interface 30. Photoluminescence studies of the top GaAs contact layer 32 indicate comparable GaAs band-edge emission at 880 nm for the bulk Ge control and Sample 2, the smoother epitaxial structure on Ge/Si, as indicated in the graph of FIG. 3. Sample 1 exhibits considerably lower photoluminescence intensity than Sample 2. Photoluminescence measurements demonstrate an inverse relationship between the GaAs contact layer 32 surface roughness and GaAs contact layer band-edge photoluminescence intensity, suggesting an increased defect density in the samples with rougher GaAs contact surfaces. Time resolved photoluminescence measurements of the GaAs contact layer 32 indicate short but comparable decay time constants of $\tau=0.23$ ns for the bulk Ge sample and $\tau=0.20$ ns for Sample 2, indicating comparable minority carrier life-times in the two structures, if similar surface recombination velocities are assumed. The GaAs contact is not passivated, thus shortening the minority carrier lifetime of the GaAs contact layer 32, due to a high recombination velocity at the exposed surface. Additionally, the heavy doping in the GaAs contact layer 32 also limits the minority carrier lifetime in this layer.

Ge Surface Smoothing

Contact mode atomic force microscopy images of the transferred germanium surface generated by the formation of micro-bubbles and micro-cracks along the hydrogen-induced layer-splitting interface reveals minimum RMS roughness of between 10 nm and 23 nm.

Figure 5A:
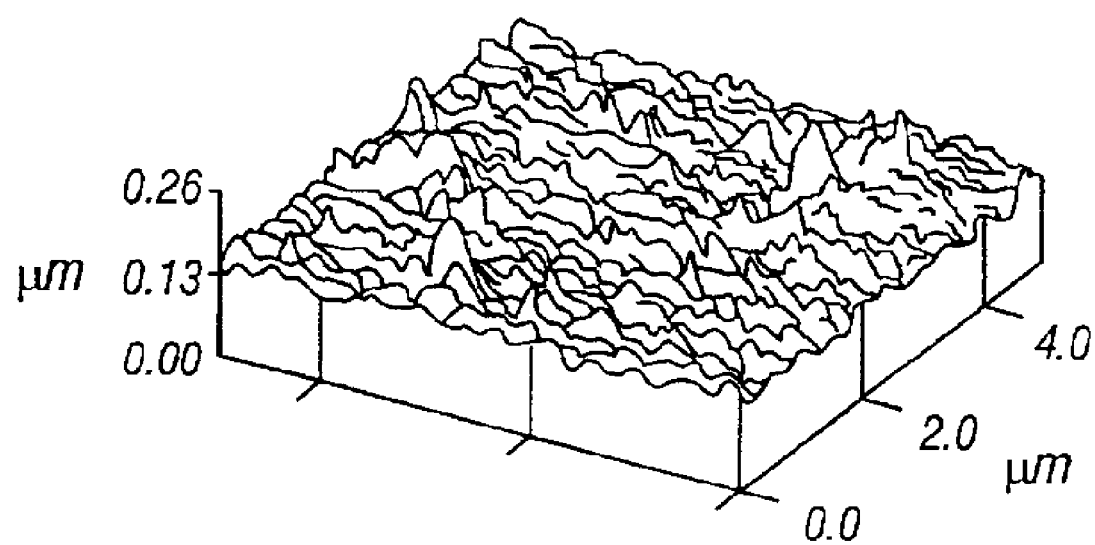
FIG. 5a is an atomic force microscopic view of an exfoliated Ge surface prior to MBE Ge buffer layer growth indicating a surface roughness of about 100 angstrom RMS.
Figure 5B:
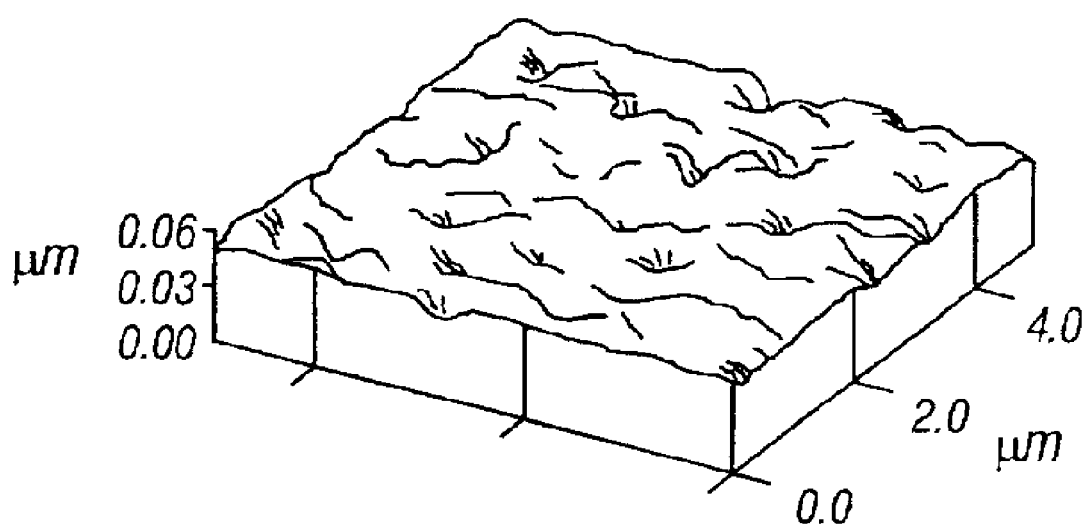
FIG. 5b is an atomic force microscopic view of the surface of FIG. 5a which has been smoothed by the epitaxial growth of a Ge buffer layer to about 20 angstrom RMS roughness with a mesa geometry.

The use of a molecular beam epitaxy Ge buffer layer to smooth the cleaved surface of the Ge heterostructure as shown in FIGS. 5a and 5b has been shown to smooth the surface from about 11 nm to as low as 1.5 nm with a mesa-like morphology that has a top surface roughness of under 1.0 nm giving a promising surface for improved solar cell growth on solar cell structures.

Figure 4:
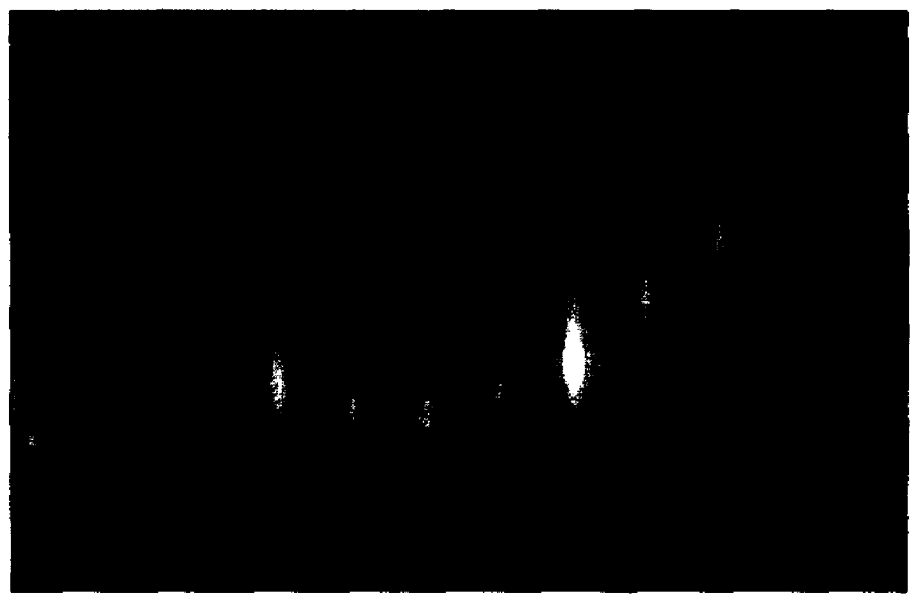
FIG. 4 is post-growth RHEED image of a surface showing Bragg rods and a reconstructed Ge surface indicating a smooth top plateau.

The triple-junction solar cell optical performance results indicate that without any surface preparation following the H-induced cleavage of the Ge layer 10, high quality Group III–V photovoltaic materials can be grown with good photoluminescence intensity and minority carrier lifetime properties relative to a cell grown on a bulk Ge substrate 34. However, to further improve the optical and electrical properties, it is desirable to reduce the exfoliated surface roughness. To smooth the exfoliated Ge surface 18 a 250 nm-thick Ge buffer layer 40 as shown in FIG. 8 was grown on the surface of the Ge/Si heterostructure 14 by molecular beam epitaxy at 450° C. at a rate of 0.1 nm/s. The surface evolution was monitored in situ with reflection high electron energy diffraction. The reflection high energy electron diffraction spectrometer (RHEED) pattern as shown in FIG. 4 following the growth also indicated a smooth (2×1) reconstructed Ge (100) surface. Epitaxial Ge growth reduced the surface RMS roughness of the transferred Ge layer from about 11 to about 1.5 nm. In addition, the morphology of the surface drastically changed to a mesa-like form, with a large relatively smooth layer of less than 1 nm surface roughness, as illustrated in the comparison of the atomic force micrographs of FIGS. 5a and 5b.

In summary, it can now be appreciated that fabrication of high quality, large, e.g. about 1 cm$^2$ area Ge (100)/Si (100) heterostructures by hydrophobic wafer bonding and H-induced layer splitting is enabled by the above disclosure. Bonded Ge/Si heterostructures 14 exhibit ohmic interfaces and are suitable as templates for heterostructured devices, such as MOCVD growth of InGaP/GaAs/Ge triple-junction solar cell structures with photoluminescence intensity and decay lifetimes comparable to those found in solar cell structures grown on bulk Ge (100) substrates. Epitaxial growth of Ge buffer layers on transferred Ge/Si layers shows promise as a means of reducing the Ge surface roughness and improving the optical quality of epitaxial GaInP/GaAs/Ge layers.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A Ge-based heterostructure comprising:
   an exfoliated Ge thin film;
   a non-Ge substrate;
   a bond formed between the exfoliated Ge thin film and the non-Ge substrate; and
   a multijunction solar cell formed on the exfoliated Ge thin film;
   wherein the exfoliated Ge thin film is formed by ion implantation into bulk Ge, bonding the bulk Ge with the non-Ge substrate and annealing the bulk Ge to exfoliate the Ge thin film from the bulk Ge.

2. The Ge-based heterostructure of claim 1, wherein the bulk Ge comprises a Ge substrate.

3. The Ge-based heterostructure of claim 1, wherein the multijunction solar cell comprises a triple junction solar cell.

4. The Ge-based heterostructure of claim 1, wherein the multijunction solar cell comprises a GaAs cell and a GaInP cell.

5. The Ge-based heterostructure of claim 1, wherein the exfoliated Ge thin film is formed by $H^+$ ion implantation into a first side of a bulk Ge wafer, contacting the first side of the bulk Ge wafer with the non-Ge substrate and annealing the bulk Ge wafer to exfoliate the Ge thin film from the bulk Ge wafer.

6. The Ge-based heterostructure of claim 1, wherein the non-Ge substrate comprises a semiconductor substrate, such that an ohmic contact is formed across an interface between the Ge thin film and the non-Ge substrate.

7. The Ge-based heterostructure of claim 1 where the bond is formed by hydrophobically passivating the non-Ge substrate and the implanted bulk Ge prior to the bond being formed and where the Ge thin film is not freestanding, but exfoliated only after the bond between the implanted bulk Ge and non-Ge substrate is created.

8. The Ge-based heterostructure of claim 1 where the non-Ge substrate is composed of Si.

9. The Ge-based heterostructure of claim 8, wherein an ohmic contact is formed across an interface between the Ge thin film and the non-Ge substrate.

10. The Ge-based heterostructure of claim 1 where the bond comprises a covalent bond formed by contacting the bulk Ge and the non-Ge substrate under pressure and annealing the bulk Ge and the non-Ge substrate.

11. The Ge-based heterostructure of claim 10 where the bond is formed when the bulk Ge and non-Ge substrate are in mutual contact under sequential steps of pressure distributed over an area of an interface between the bulk Ge and the non-Ge substrate.

12. The Ge-based heterostructure of claim 11 where the sequential steps of pressure distributed over an area of the interface comprise sequentially smaller magnitudes of pressure across sequentially larger areas of the interface.

13. The Ge-based heterostructure of claim 1 further comprising an anti-bubble layer located between the non-Ge substrate and the Ge thin film to create a bonded interface between the non-Ge substrate and the anti-bubble layer to reduce hydrogen bubble formation when the Ge film is bonded to the non-Ge substrate.

14. The Ge-based heterostructure of claim 13 where the non-Ge substrate is Si and the anti-bubble layer is amorphous Si.

15. A Ge-based heterostructure comprising:
    a Ge film; and
    a non-Ge substrate bonded to the Ge film wherein the Ge film has been exfoliated from $H^+$ ion implanted bulk Ge by annealing,
    where the non-Ge substrate and the bulk Ge are rendered hydrophilic or hydrophobic by wet chemical cleaning the bulk Ge and non-Ge substrate prior to bonding and then annealing the cleaned bulk Ge and non-Ge substrate to bond the bulk Ge and the non-Ge substrate.

16. The Ge-based heterostructure of claim 15 further comprising a semiconductor device fabricated on the Ge film.

17. The Ge-based heterostructure of claim 15, where the non-Ge substrate and the bulk Ge are rendered hydrophilic by wet chemical cleaning.

18. The Ge-based heterostructure of claim 15, where the non-Ge substrate and the bulk Ge are rendered hydrophobic by wet chemical cleaning.

19. The Ge-based heterostructure of claim 15, wherein the exfoliated Ge thin film is formed by $H^+$ ion implantation into a first side of a bulk Ge wafer, contacting the first side of the bulk Ge wafer with the non-Ge substrate and annealing the bulk Ge wafer to exfoliate the Ge thin film from the bulk Ge wafer.

20. The Ge-based heterostructure of claim 15, wherein the non-Ge substrate comprises a semiconductor substrate, such that an ohmic contact is formed across an interface between the Ge thin film and the non-Ge substrate.

21. The Ge-based heterostructure of claim 20, wherein covalent bonds are formed between the Ge thin film and the non-Ge substrate comprising a silicon wafer.

22. The Ge-based heterostructure of claim 15, further comprising a multijunction solar cell containing a GaAs cell and a GaInP cell.

23. A Ge-based heterostructure comprising:
    a Ge film;
    a non-Ge substrate bonded to the Ge film wherein the Ge film has been exfoliated from $H^+$ ion implanted bulk Ge by annealing; and
    a semiconductor device fabricated on the Ge film,
    where the semiconductor device fabricated on the Ge film comprises a triple junction solar cell.

24. The Ge-based heterostructure of claim 23, wherein the solar cell is made by using MOCVD and the smoothing layer comprises a Ge epitaxial layer formed on the exfoliated surface of the Ge thin film.

25. A Ge-based heterostructure comprising:
a Ge film; and
a non-Ge substrate bonded to the Ge film wherein the Ge film has been exfoliated from H$^+$ ion implanted bulk Ge by annealing; and
a smoothing layer on the exfoliated Ge film, wherein the smoothing layer is comprised of a Ge layer disposed onto the exfoliated Ge film using molecular beam epitaxy.

26. A Ge-based heterostructure comprising:
an exfoliated Ge film having bulk properties of Ge;
a non-Ge substrate bonded to the exfoliated Ge film; and
a multijunction solar cell formed on the exfoliated Ge film;
wherein the exfoliated Ge film is formed by ion implantation into bulk Ge, bonding the bulk Ge with the non-Ge substrate and annealing the bulk Ge to exfoliate the Ge film from the bulk Ge.

27. The Ge-based heterostructure of claim 26 where the non-Ge substrate comprises a silicon substrate which is indirectly bonded to the exfoliated Ge film using an amorphous silicon bonding layer located between the silicon substrate and the Ge film.

28. The Ge-based heterostructure of claim 26 where a bonding layer located between the non-Ge substrate and the Ge film creates a hydrophilic interface with the non-Ge substrate.

29. The Ge-based heterostructure of claim 26, wherein the multijunction solar cell comprises a triple junction solar cell.

30. The Ge-based heterostructure of claim 26, wherein the multijunction solar cell comprises a GaAs cell and a GaInP cell.

31. The Ge-based heterostructure of claim 26, wherein the exfoliated Ge film is formed by H$^+$ ion implantation into a first side of a bulk Ge wafer, contacting the first side of the bulk Ge wafer with the non-Ge substrate and annealing the bulk Ge wafer to exfoliate the Ge film from the bulk Ge wafer.

32. The Ge-based heterostructure of claim 26, wherein the non-Ge substrate comprises a semiconductor substrate, such that an ohmic contact is formed across an interface between the Ge film and the non-Ge substrate.

33. The Ge-based heterostructure of claim 32, wherein covalent bonds are formed between the Ge film and the non-Ge substrate comprising a silicon wafer.

34. The Ge-based heterostructure of claim 26 further comprising an anti-bubble layer located between the non-Ge substrate and the Ge film to create a hydrophilic interface between the anti-bubble layer and the non-Ge substrate.

35. A Ge-based heterostructure comprising:
an exfoliated Ge film having the bulk properties of Ge;
a non-Ge substrate bonded to the exfoliated Ge film; and
a smoothing layer on the exfoliated Ge film, wherein the smoothing layer comprises a Ge epitaxial layer formed on the exfoliated surface of the Ge film.

36. A method of making a Ge-based heterostructure comprising an exfoliated Ge film having bulk properties of Ge, a non-Ge substrate bonded to the exfoliated Ge film, and a multijunction solar cell formed on the exfoliated Ge film, wherein the method comprises:
performing ion implantation into bulk Ge;
bonding the bulk Ge with the non-Ge substrate,
annealing the bulk Ge to exfoliate the Ge film from the ion implanted bulk Ge; and
forming the multijunction solar cell on the exfoliated Ge film bonded to the non-Ge substrate.

37. The method claim 36, wherein the multijunction solar cell comprises a triple junction solar cell.

38. The method of claim 36, wherein:
the step of performing ion implantation into bulk Ge comprises performing H$^+$ ion implantation into a first side of a bulk Ge wafer; and
the step of bonding the bulk Ge with the non-Ge substrate comprises contacting the first side of the bulk Ge wafer to the non-Ge substrate.

39. The method of claim 36, further comprising:
hydrophobically passivating the non-Ge substrate and the implanted bulk Ge substrate prior to the step of bonding; and
annealing the non-Ge substrate and the bulk Ge to covalently bond the non-Ge substrate to the bulk Ge prior to exfoliating the Ge film.

40. The method of claim 36, wherein the non-Ge substrate comprises a silicon substrate, such that an ohmic contact is formed across an interface between the Ge film and the non-Ge substrate.

41. A method of making a Ge based heterostructure comprising a Ge film and a non-Ge substrate bonded to the Ge film, wherein the method comprises:
performing H$^+$ ion implantation into bulk Ge;
rendering the bulk Ge and the non-Ge substrate hydrophobic or hydrophilic by wet chemical cleaning the bulk Ge and non-Ge substrate to form a hydrophobically or hydrophilically passivated surface on the bulk Ge and a hydrophobically or hydrophilically passivated surface on the non-Ge substrate;
contacting the passivated surface of the bulk Ge with the passivated surface of the non-Ge substrate;
annealing the bulk Ge and the non-Ge substrate to bond the passivated surface of the bulk Ge to the passivated surface of the non-Ge substrate; and
annealing the bulk Ge to exfoliate the Ge film from the ion implanted bulk Ge.

42. The method of claim 41, further comprising forming a multijunction solar cell on the Ge film.

43. The method of claim 41, wherein:
the step of performing ion implantation into bulk Ge comprises performing H$^+$ ion implantation into a first side of a bulk Ge wafer;
the step of bonding bulk Ge with the non-Ge substrate comprises contacting the first side of the bulk Ge wafer to the non-Ge substrate; and
the step of forming a multijunction solar cell comprises forming a triple junction solar cell.

44. The method of claim 41, wherein the non-Ge substrate comprises a silicon substrate, such that an ohmic contact is formed across an interface between the Ge film and the non-Ge substrate.

45. The method of claim 41, wherein the step of rendering comprises rendering the bulk Ge and the non-Ge substrate hydrophobic.

46. The method of claim 41, wherein the step of rendering comprises rendering the bulk Ge and the non-Ge substrate hydrophilic.

47. A method of making a Ge-based heterostructure comprising a Ge film and a non-Ge substrate bonded to the Ge film, wherein the method comprises:
performing ion implantation into bulk Ge;
bonding the bulk Ge and the non-Ge substrate;
annealing the bulk Ge to exfoliate the Ge film from the ion implanted bulk Ge; and forming a smoothing layer on the exfoliated Ge film, wherein the step of forming the smoothing layer comprises epitaxially depositing a Ge layer on the Ge film.

48. The method claim 47, further comprising forming a multijunction solar cell on the smoothing layer.

49. The method of claim 47, wherein:

the step of performing ion implantation into bulk Ge comprises performing $H^+$ ion implantation into a first side of a bulk Ge wafer;

the step of bonding bulk Ge with the non-Ge substrate comprises contacting the first side of the bulk Ge wafer to the non-Ge substrate; and the step of forming a multijunction solar cell comprises forming a triple junction solar cell.

50. The method of claim 47, wherein the non-Ge substrate comprises a silicon substrate, such that an ohmic contact is formed across an interface between the Ge film and the non-Ge substrate.

51. The method of claim 47, further comprising:

passivating the non-Ge substrate and the implanted bulk Ge substrate prior to the step of bonding; and annealing the non-Ge substrate and the bulk Ge to covalently bond the non-Ge substrate to the bulk Ge prior to exfoliating the Ge film.

* * * * *

UNITED STATES PATENT AND TRADEMARK OFFICE
CERTIFICATE OF CORRECTION

| | | |
|---|---|---|
| PATENT NO. | : 7,019,339 B2 | Page 1 of 1 |
| APPLICATION NO. | : 10/125133 | |
| DATED | : March 28, 2006 | |
| INVENTOR(S) | : Harry A. Atwater, Jr. and James M. Zahler | |

It is certified that error appears in the above-identified patent and that said Letters Patent is hereby corrected as shown below:

Col. 1, lines 14-16, the STATEMENT REGARDING FEDERALLY SPONSORED RESEARCH OR DEVELOPMENT paragraph should read as follows:

--     This invention was made with government support under Contract No. DE-AC36-99GO10337, Midwest Research Institute Subcontract No. ACQ-1-30619-13 awarded by the Department of Energy.  The government has certain rights in the invention.--

Signed and Sealed this

Twenty-ninth Day of August, 2006

JON W. DUDAS
*Director of the United States Patent and Trademark Office*